United States Patent [19]

Moon

[11] Patent Number: 5,552,031

[45] Date of Patent: Sep. 3, 1996

[54] PALLADIUM ALLOY PLATING COMPOSITIONS

[75] Inventor: Sung S. Moon, Pusan, Rep. of Korea

[73] Assignee: Hanyang Chemical Ind., Co., Pusan, Rep. of Korea

[21] Appl. No.: 391,978

[22] Filed: Feb. 21, 1995

[30] Foreign Application Priority Data

Feb. 26, 1994 [KR] Rep. of Korea .................. 943550

[51] Int. Cl.$^6$ ................... C25D 3/62; C25D 3/56
[52] U.S. Cl. .................. 205/247; 205/250; 205/255; 205/257; 106/105; 106/123; 106/124; 106/126; 106/128
[58] Field of Search ...................... 205/238, 239, 205/242, 247, 250, 252, 253, 255; 106/1.05, 1.13, 1.15, 1.23, 1.24, 1.26, 1.28

[56] References Cited

U.S. PATENT DOCUMENTS 4,741,818  5/1988  Nobel et al. .................. 205/238
4,911,798  12/1988  Abys et al. .................. 205/238

FOREIGN PATENT DOCUMENTS 0225422  6/1986  European Pat. Off. .
57-47892  3/1982  Japan .

Primary Examiner—John Niebling
Assistant Examiner—Edna Wong
Attorney, Agent, or Firm—Anderson Kill Olick & Oshinsky, P.C.

[57] ABSTRACT

A palladium alloy plating composition comprising 4 to 20 g/l of palladium ion, 0.3 to 2.0 g/l of gold ion, 5 to 100 g/l of a conductive salt and 0.5 to 20 g/l of a complexing agent, and optionally 0.3 to 5 g/l of an alloying metal ion provides a plating with an excellent solderability and flexibility onto a substrate by an electrical plating method.

11 Claims, No Drawings

PALLADIUM ALLOY PLATING COMPOSITIONS

FIELD OF THE INVENTION

The present invention relates to a palladium alloy plating composition comprising two metallic elements of palladium and gold, a complexing agent and a conductive salt, and optionally an alloying metal, particularly suitable for coating lead frames, a printed circuit boards, connectors and the like.

BACKGROUND OF THE INVENTION

Many devices used in electronics such as lead frames, printed circuit boards and connectors are often subjected to silver plating followed by soldering. The silver plating, however, causes many problems such as discoloration of silver-plated parts, formation of copper oxide layer, poor adhesion in molding and water pollution problem.

To ameliorate such problems, therefore, various palladium or palladium alloy plating compositions have been developed. The use of a palladium or palladium alloy is attractive due to its ability to enhance the electric conductivity and its excellent corrosion resistance, abrasion resistance and non-porosity to various chemicals and substances. In a palladium or palladium alloy plating composition, however, it is important that the palladium and other metal compounds are provided in a stable state, and a complexing agent and a conductive salt are properly selected depending on the metal components so as for the composition to have a good stability and uniform platability.

For instance, U.S. Pat. No. 4,741,818 discloses a palladium or palladium alloy plating electrolyte comprising a palladium compound, one or more alloying metal compounds and a complexing agent such as chelidamic acid, orotic acid or 2-pyrrolidone-5-carboxylic acid, in order to improve the stability and platability.

U.S. Pat. No. 4,715,935 discloses a method for plating a substrate with a palladium alloy plating composition comprising a palladium source, an oxalate as a complexing agent and, optionally, an additional alloying metal compound.

However, the above compositions still suffer from unsatisfactory solderability and low flexibility when applied on a lead frame and the like due to, e.g., an increase in the internal stress caused by hydrogen brittleness; and, therefore, a need has still existed for a stable plating composition containing palladium with improved soldering characteristics.

SUMMARY OF THE INVENTION

Accordingly, it is an object of the present invention to provide a palladium alloy plating composition having an excellent stability, solderability and flexibility.

Another object of the present invention is to provide a method for plating a palladium alloy onto a substrate using the palladium alloy plating composition.

A further object of the present invention is to provide an article plated by using the palladium alloy plating composition.

In accordance with one aspect of the present invention, there is provided a palladium alloy plating composition comprising 4 to 20 g/l of palladium ion, 0.3 to 2.0 g/l of gold ion, 5 to 100 g/l of a conductive salt and 0.5 to 20 g/l of a complexing agent.

In accordance with another aspect of the present invention, there is provided a method for plating a substrate with a palladium alloy which comprises immersing the substrate and an anode in the plating composition of the present invention; and applying a current of 0.5 to 1.5 ASD across the substrate and the anode in the plating composition at a temperature ranging from 30° to 40° C. to, thereby effectuate the plating of the substrate in a desired thickness.

DETAILED DESCRIPTION OF THE INVENTION

The novel palladium alloy plating composition comprises two metallic components: i.e., palladium and gold as the main effective ingredients, and optionally an additional alloying metal selected from the group consisting of nickel, cobalt, copper, tin, selenium, tungsten, molybdenum and titanium. In accordance with the present invention, it has been unexpectedly found that using a selected range of the ratio of the palladium and gold, and a suitable complexing agent and a conductive salt remarkably enhances the stability of the plating composition as well as the solderability and flexibility of a plated substrate.

As a source of palladium, various palladium compounds, preferably in the form of a salt, may be employed in an amount of 4 to 20 g/l preferably 5 g/l, measured in terms of palladium ion in the novel composition.

Representative palladium salts which may be used as the palladium source include: palladous tetraammonium dichloride, palladous diamine dichloride, palladous diammonium dichloride, palladous tetraamine dichloride, palladous diamine dinitride, palladium oxide, palladium nitrate and palladium cyanide. Among them palladous diamine dichloride is preferred. The palladium salt is preferably reacted with a conductive salt, e.g., ammonium phosphate before being introduced into the plating composition.

As a source of gold, various gold compounds, for example, potassium gold(I) cyanide, potassium gold(III) cyanide, gold chloride hydrate and gold(III) oxide hydrate, may be employed in an amount ranging from 0.3 to 2.0 g/l, preferably 0.5 g/l, measured in terms of gold ion, in the novel composition. Potassium gold(I) cyanide is preferred. The gold compound is preferably reacted with a conductive salt, e.g., diethylamine hydrochloride before being introduced into the plating composition so as to avoid the precipitation and neutralization thereof in the composition.

The optionally added alloying metal compound in the present plating composition may be selected from suitable salts capable of forming a stable alloy; and preferably be reacted with a conductive salt or a complexing agent to stabilize the composition before its introduction into the plating composition. The alloying metal may be employed in an amount ranging from 0.3 to 6 g/l, preferably 3 to 5 g/l, measured in terms of the metal ion, in the composition.

The additional alloying metal which may be employed in the inventive composition is preferably selected from the group consisting of nickel, cobalt, copper, tin, selenium, tungsten, molybdenum, titanium and a mixture thereof. Said nickel may be introduced into the composition in the form of a salt, for instance, nickel sulfate hexahydrate, nickel chloride hexahydrate, nickel sulfamate, phthalocyanine nickel, nickel carbonate tetrahydrate, nickel nitrate, nickel hydroxide, nickel amine sulfate or a mixture thereof; and, in case of cobalt, cobaltous sulfate heptahydrate, cobaltous chloride hexahydrate, cobalt oxide, cobalt carbonate, cobalt naphthenate, phthalocyanine cobalt or a mixture thereof may be used.

Further, said copper may be introduced in the form of a salt, for example, cupric sulfate pentahydrate, cuprous thiophenolate, phthalocyanine copper, cuprous cyanide, cupric pyrophosphate, cupric carbonate or a mixture thereof; in case of selenium, selenium dioxide, selenium grey, selenous acid, sodium selenate or a mixture thereof may be used.

Said tin may be introduced in the form of a salt such as stannous chloride dihydrate, stannous oxalate, sodium stannate, potassium stannate or a mixture thereof; and in case of tungsten, hexacarbonyl tungsten, tungsten chloride, tungsten oxide, sodium tungstate or a mixture thereof may be used.

Said molybdenum may be introduced in the form of a salt such as molybdenum(V) chloride, sodium molybdate, hexacarbonyl molybdenum, molybdenum(VI) oxide, ammonium molybdate or a mixture thereof; and in case of titanium, 1,2-dimethoxyethane titanium chloride complex, titanium dioxide, titanium trichloride, titanium tetrachloride, titanous sulfate or a mixture thereof may be used.

The complexing agent may be selected to form a stable complex of the metals to be alloyed, to thereby provide a stable plating composition. The complexing agent may be an aliphatic, aromatic or amine compound and employed in an amount of 0.5 to 20 g/l, preferably 1 to 10 g/l in the composition. Specific examples of the complexing agent may include 4-oxopentanoic acid(9Cl), diammonium ethylenediaminetetraacetate, N-3-hydroxybutylidene-p-sulfanilic acid, N,N,N',N'-tetrakis(2-pyridylmethyl)ethylene-diamine and benzaldehyde tristyrilphenate.

The conductive salt may be selected depending on the kind of the alloying metal selected and may include phosphates, oxides, hydroxides, ammonium salts, amine salts, citrates and optionally alkali metal complexes. It may be employed in an amount of 5 to 100 g/l, preferably 20 to 70 g/l, in the composition. The conductive salt is preferably introduced into the plating composition after it has fully reacted with the alloying metal. Representative examples of the conductive salt are disodium hydrogen phosphate, dipotassium ammonium hydrogen phosphate, sodium dihydrogen phosphate, dihydrogen phosphate, ammonium phosphate, ammonium sulfate, ammonium oxalate hydrate, ammonium oxide, diammonium hydrogen citrate, diethylamine hydrochloride, potassium hydroxide, potassium cyanide, potassium citrate, sodium hydroxide, aminoacetic acid, ethylenediamine, potassium sodium tartrate or a mixture thereof.

The composition of the present invention may include other additives such as a brightener, a surface modifier and a stress modifier.

The brightener which may be employed in the present invention includes compounds containing an amino, alkoxy, aromatic aldehyde or unsaturated carboxyl group, and is preferably employed in an amount of 0.005 to 0.05 g/l, more preferably 0.01 to 0.05 g/l. Representative examples of the brightener include benzene sulfonate, furaldehyde, 2-methoxy-1-naphthaldehyde, (+)-N,N,N',N'-tetramethyl-L-tartaricdiamide, polyethyleneglycolmonolaurylether, laurylmethylaniline or a mixture thereof.

Each of the surface modifiers and the stress modifiers may be preferably used in an amount of 0.001 to 0.05 g/l, more preferably 0.01 to 0.02 g/l, respectively. Representative examples of the surface modifier are poly(oxy-1,2-ethanediyl)-α-butyl-N-hydroxide, polyethoxylated aliphatic monoalkanolamide, N-(3-hydroxybutylidene)-p-sulfanilic acid, tridecyloxypoly(ethyleneoxy) ethanol(III) or mixtures thereof. Representative example of the stress modifier are sodium salts of sulfated alkylphenoxypoly(ethyleneoxy)ethanol, diisodecylphthalate, saccharin or a mixture thereof.

The plating composition in accordance with the present invention is stable and not affected by impurities, owing to using properly a conductive salt and a complexing agent depending on the alloying metal, such that the plating can be sustained uniformly for a long term.

Virtually all substrates, e.g., lead frames, a printed circuit boards, connectors, which are subjected to a soldering process can be plated in accordance with the present invention.

The novel plating composition can be prepared by directly dissolving a palladium compound, a gold compound, an alloying metal compound, a conductive salt, a complexing agent and other additives in water, alternatively, prepared by reacting each of the palladium compound, the gold compound and the additional alloying metal compound previously with the conductive salt or the complexing agent, and dissolving the resultant in water together with the other components.

A substrate to be plated and an anode are immersed in the plating composition thus obtained, and then a current of 0.5 to 1.5 ASD(Ampere per Square Decimeter), more preferably 0.7 to 1.0 ASD, is applied across the substrate and the anode, while maintaining the temperature of the composition at 30° to 40° C., more preferably at 35° C., and preferably stirring the plating composition.

Although the specific gravity of the plating composition can be varied depending on the plating method, it generally ranges from 10 to 25 Baume. The pH of the composition is adjusted to a range preferably from 5 to 13.

The following Examples are intended to illustrate the present invention more specifically, without limiting the scope of the invention.

In the Examples, the solderability and flexibility were measured in accordance with the following Reference Examples.

Reference Example 1

Solderability

A substrate plated with the composition of the examples was mold-hardened at 175° C. for 3 minutes and then post-hardened at the same temperature for 3 hours. The hardened substrate was heated at 145° C. for 96 hours, steam-aged at 95° C. for 32 hours, and then submerged in a flux(Kester) for 3 seconds. The resultant was soldered at 260° C. for 3 seconds and the ratio of the soldered parts was observed by a microscope of Nikon Measurescope UM-2(25X).

Reference Example 2

Flexibility

The plated substrate was subjected to a bending with an angle of 90°, and then cracks on the surface of the substrate was observed with bear eyes.

EXAMPLE 1

1L of a plating composition(pH 5, 35° C.) was prepared by dissolving the following ingredients in distilled water.

| Ingredients | Amounts |
| --- | --- |
| palladous tetraammonium dichloride | 10 g/l |
| potassium gold (I) cyanide | 0.74 g/l |
| ammonium phosphate | 50 g/l |
| ammonium hydroxide | 1 ml/l |

| Ingredients | Amounts |
| --- | --- |
| 4-oxopentanoic acid (9 Cl) | 2 g/l |
| potassium sodium tartrate | 10 g/l |
| bezene sulfonate | 0.1 g/l |

A lead frame(Motorola 14 Lead SOIC) was plated with 1L of the resulting plating composition at a current of 1.0 ASD to give a glossy light grey plating of 70% palladium and 30% gold. The solderability and flexibility of the plated lead frame were determined in accordance with the above methods and the results snowed uniform plating with 100% solderability and no cracking.

EXAMPLE 2

1L of a plating composition(pH 10, 35° C.) was prepared by dissolving the following ingredients in distilled water.

| Ingredients | Amounts |
| --- | --- |
| palladous diamine dichloride | 10 g/l |
| potassium gold (I) cyanide | 0.74 g/l |
| nickel hydroxide | 12.5 g/l |
| ammonium phosphate | 50 g/l |
| 4-oxopentanoic acid (9 Cl) | 5 g/l |
| lauryl methyl aniline | 0.005 g/l |
| saccharin | 0.005 g/l |
| pH adjusted to 10 with ammonium hydroxide | |

The procedures described in Example 1 was repeated by using the plating composition thus prepared to give a glossy plating of 75% palladium, 20% nickel and 5% gold with 18 to 20K. The results of the solderability and flexibility of the plated lead frame snowed uniform 100% solderability and no cracking.

EXAMPLE 3

1L of a plating composition(pH 10, 35° C.) was prepared by dissolving the following ingredients in distilled water, provided that the cobalt source was reacted with ethylenediamine tetraacetate as a complexing agent before being introduced.

| Ingredients | Amounts |
| --- | --- |
| palladous diamine dinitride | 11.1 g/l |
| potassium gold (I) cyanide | 0.74 g/l |
| cobalt naphthenate | 19.4 g/l |
| ammonium dihydrogen phosphate | 50 g/l |
| diammonium hydrogen phosphate | 15 g/l |
| potassium hydroxide | 20 g/l |
| diammonium ethylenediaminetetraacetate | 12 g/l |
| lauryl methyl aniline | 0.01 g/l |
| poly(oxy-1,2-ethanediyl)-α-butyl-N-hydroxide | 0.02 g/l |

The procedures described in Example 1 was repeated by using the plating composition thus prepared to give a glossy plating of 75% palladium, 20% cobalt and 5% gold with 18 to 20K. The results of the solderability and flexibility of the plated lead frame snowed uniform 100% solderability and no cracking.

EXAMPLE 4

1L of a plating composition(pH 10, 35° C.) was prepared by dissolving the following ingredients in distilled water.

| Ingredients | Amounts |
| --- | --- |
| palladium cyanide | 7.5 g/l |
| potassium gold (III) cyanide | 0.88 g/l |
| copper (II) phthalocyanine | 7 g/l |
| ammonium dihydrogen phosphate | 70 g/l |
| ammonium oxalate hydrate | 10 g/l |
| ethylenediamine | 5 g/l |
| N,N,N'N'-tetrakis(2-pyridylmethyl)ethylenediamine | 1 g/l |
| (+)-N,N,N,N'-tetramethyl-L-tartaric diamide | 0.02 g/l |
| N-3-hydroxybutylidene-p-sulfanilic acid | 0.007 g/l |

The procedures described in Example 1 was repeated at a current of 0.5 to 1.0 ASD by using the plating composition thus prepared to give a glossy plating of 70% palladium, 25% copper and 5% gold with 12 to 14K. The results of the solderability and flexibility of the plated lead frame showed uniform 98% solderability and no cracking.

EXAMPLE 5

1L of a plating composition(pH 10, 35° C.) was prepared by dissolving the following ingredients in distilled water, provided that the gold source was reacted with diethylamine hydrochloride, potassium sodium stannate and sodium hydroxide as conductive salts before being introduced.

| Ingredients | Amounts |
| --- | --- |
| palladous tetraamine dichloride | 10 g/l |
| gold chloride hydrate | 0.4 g/l |
| stannous chloride dihydrate | 6.7 g/l |
| diethylamine hydrochloride | 55 g/l |
| potassium sodium tartrate | 20 g/l |
| sodium hydroxide | 10 g/l |
| benzaldehyde tristyrilphenate | 0.5 g/l |
| furaldehyde | 0.025 g/l |
| polyethoxylated aliphatic monoalkanol amide | 0.005 g/l |

The procedures described in Example 1 was repeated at a current of 0.8 to 1.5 ASD by using the plating composition thus prepared to give a glossy plating of 90% palladium, 6% tin and 4% gold with 20K. The results of the solderability and flexibility of the plated lead frame showed uniform 99% solderability and no cracking.

EXAMPLE 6

1L of a plating composition(pH 10, 35° C.) was prepared by dissolving the following ingredients in distilled water, provided that the tungsten source was reacted with sodium dihydrogen phosphate, ammonium phosphate, aminoacetate and potassium hydroxide as conductive salts and diammonium ethylenediaminetetraacetate as a complexing agent before being introduced.

| Ingredients | Amounts |
| --- | --- |
| palladous diamine dichloride | 10 g/l |
| potassium gold (I) cyanide | 0.74 g/l |
| tungsten chloride | 5.1 g/l |
| sodium dihydrogen phosphate | 70 g/l |
| ammonium phosphate | 20 g/l |
| aminoacetic acid | 2 g/l |
| potassium hydroxide | 20 g/l |
| diammonium ethylenediaminetetraacetate | 5 g/l |

-continued

| Ingredients | Amounts |
| --- | --- |
| benzene sulfonate | 0.05 g/l |
| sulfated alkylphenoxypoly (ethyleneoxy)-ethanol sodium salt | 0.005 g/l |

The procedures described in Example 1 was repeated at a current of 0.7 to 1.2 ASD by using the plating composition thus prepared to give a glossy plating of 90% palladium, 5% tungsten and 5% gold with 20 to 22K. The results of the solderability and flexibility of the plated lead frame showed uniform 100% solderability and no cracking.

Comparative Example 1L of a plating composition(pH 10, 35° C.) was prepared by dissolving the following ingredients in distilled water.

| Ingredients | Amounts |
| --- | --- |
| palladous diammonium dichloride | 10 g/l |
| nickel chloride | 20 g/l |
| potassium hydrogen phosphate | 30 g/l |
| chelidamic acid | 20 g/l |
| picolinic acid | 2 g/l |
| nitrotriacetic acid | 1 g/l |
| pH adjusted to 10 with ammonium hydroxide | |

The procedures described in Example 1 was repeated at a current of 0.5 to 1.0 ASD by using the plating composition thus prepared to give 65% solderability and cracking of the plated lead frame.

As shown above, the palladium alloy plating composition prepared in each of the Examples gives an improved solderability and flexibility to the plated substrate. On the other hand, a plating composition prepared in Comparative Example, which does not contain a gold and includes a ratio of an alloying metals other than that of the present composition, results in a poor plating and cracking.

While the invention has been described in connection with the above specific embodiments, it should be recognized that various modifications and changes as may be apparent to those skilled in the art to which the invention pertains may be made and also fall within the scope of the invention as defined by the claims that follow.

What is claimed is:

1. A palladium-gold alloy plating composition comprising 4 to 20 g/l of palladium in the form of a soluble palladium compound, 0.3 to 2.0 g/l of gold in the form of a soluble gold compound, 5 to 100 g/l of a conductive salt and 0.5 to 20 g/l of a complexing agent selected from 4-oxopentanoic acid, benzaldehyde tristyrilphenate, and a mixture thereof.

2. The composition in accordance with claim 1, wherein the palladium compound is selected from the group consisting of palladous tetraammonium dichloride, palladous diamine dichloride, palladous diammonium dichloride, palladous tetraamine dichloride, palladous diamine dinitride, palladium oxide, palladium nitrate and palladium cyanide.

3. The composition in accordance with claim 1, wherein the gold compound is selected from the group consisting of potassium gold(I) cyanide, potassium gold(III) cyanide, gold chloride hydrate and gold(III) oxide hydrate.

4. The composition in accordance with claim 1, further comprising 0.3 to 5 g/l of an alloying metal in the form of a soluble compound, selected from a nickel compound, a tin compound, and a mixture thereof.

5. The composition in accordance with claim 4, wherein the nickel compound is selected from the group consisting of nickel sulfate hexahydrate, nickel chloride hexahydrate, nickel sulfamate, phthalocyanine nickel, nickel carbonate tetrahydrate, nickel nitrate, nickel hydroxide, nickel amine sulfate and a mixture thereof.

6. The composition in accordance with claim 4, wherein the tin compound is selected from the group consisting of stannous chloride dihydrate, stannous oxalate, sodium stannate, potassium stannate and a mixture thereof.

7. The composition in accordance with claim 1 further comprising 0.005 to 0.05 g/l of a brightener, 0.001 to 0.05 g/l of a surface modifier, 0.001 to 0.05 g/l of a stress modifier or a mixture thereof.

8. The composition in accordance with claim 7, wherein the brightener is selected from the group consisting of benzene sulfonate, furaldehyde, laurylmethylaniline and a mixture thereof.

9. The composition in accordance with claim 7, wherein the surface modifier is polyethoxylated aliphatic monoalkanolamide.

10. The composition in accordance with claim 7, wherein the stress modifier is saccharin.

11. A method for plating a substrate selected from a lead frame, printed circuit board and connector with a palladium alloy which comprises immersing the substrate and an anode in the plating composition recited in claim 1; and applying a current of 0.5 to 1.5 ASD across the substrate and the anode in the plating composition at a temperature ranging from 30° to 40° C. to thereby effectuate the plating of the substrate.

* * * * *